United States Patent [19]

Nuernberger

[11] Patent Number: 4,923,032

[45] Date of Patent: May 8, 1990

[54] CEILING PANEL SOUND SYSTEM

[76] Inventor: Mark A. Nuernberger, 1553-A S. 25th St., Milwaukee, Wis. 53204

[21] Appl. No.: 384,300

[22] Filed: Jul. 21, 1989

[51] Int. Cl.$^5$ .............................................. H05K 5/00

[52] U.S. Cl. .................................. 181/150; 181/141; 181/144; 381/90; 381/124; 381/205

[58] Field of Search ............... 181/141, 144, 147, 148, 181/150, 171; 381/86, 124, 90, 158, 205

[56] References Cited

U.S. PATENT DOCUMENTS

| | | | |
|---|---|---|---|
| 3,912,865 | 10/1975 | Seebinger | 381/124 |
| 4,057,689 | 11/1977 | Stallings, Jr. | 381/90 |
| 4,330,691 | 5/1982 | Gordon | 381/90 |
| 4,484,658 | 11/1984 | Grote | 181/150 |
| 4,597,470 | 7/1986 | Takagi et al. | 181/141 |

FOREIGN PATENT DOCUMENTS

| | | | |
|---|---|---|---|
| 2706524 | 8/1978 | Fed. Rep. of Germany | 181/150 |

*Primary Examiner*—Benjamin R. Fuller
*Attorney, Agent, or Firm*—Andrus, Sceales, Starke & Sawall

[57] ABSTRACT

A low-profile modular sound system comprises a completely self contained high fidelity speaker system which may be easily installed in the supporting gridwork for a suspended ceiling in place of a conventional acoustic ceiling tile. Each of a pair of speakers, including a woofer and tweeter, is installed in a rectangular mounting panel of a size and shape corresponding to a ceiling tile. A shallow rear housing is attached to the mounting panel to enclose the rear portions of the speakers and any other system components, such as a balance control. A single electrical connector attached to the outside of the housing provides an interconnectiion between the speaker leads and the external source of power for the speakers. The front face of the module includes a demountable grill which is attached to the mounting panel to enclose the front faces of the speakers and includes an acoustically transparent covering of cloth or the like which may be colored and/or textured to match the surface of the adjacent ceiling tiles. The module may be placed in the square enclosing section of a conventional supporting grid for a suspended ceiling such that it is supported around the peripheral edge by the conventional inverted T-shaped supports used in such ceilings.

13 Claims, 1 Drawing Sheet

CEILING PANEL SOUND SYSTEM

BACKGROUND OF THE INVENTION

The present invention relates to a high fidelity speaker system and, more particularly, to a modular speaker system for installation in a suspended ceiling in place of a conventional ceiling tile.

It is well known in the art to mount a speaker for a second system in an acoustic ceiling tile or panel, which tile or panel is supported by a conventional suspended ceiling supporting grid. It is also known to mount a single speaker in an enclosure with the enclosure supported by a suspended ceiling supporting grid. The enclosure may include a ceiling tile facing or a face plate of some other material.

U.S. Pat. No. 4,057,689 discloses a modular assembly for a single speaker mounted in a self-contained enclosure and adapted to be placed in a supporting grid for a conventional suspended ceiling. The speaker is mounted in an opening in a conventional ceiling tile or a more rigid rectangular plate and is enclosed on the backside of the supporting tile or plate by a spherical primary enclosure. Each speaker modular is intended to be used with a plurality of identical speaker modules in a continuous ceiling arrangement wherein they are electrically interconnected for simultaneous reproduction of a common input signal. However, the substantial depth of the spherical rear enclosure makes the speaker module impractical for installation in a typical suspended ceiling system where it is desirable to keep the space between the ceiling and the structure from which it is suspended at a minimum.

U.S. Pat. No. 3,912,865 shows a speaker mounted in a bell-shaped housing and an assembly for attaching the speaker and housing to a conventional acoustic ceiling panel. To compensate for the low strength of the ceiling panel, the mounting assembly for the speaker on the back face of the panel is attached directly to the supporting gridwork for the ceiling. The mounting system is structurally complex, making installation and removal somewhat tedious and time consuming. In addition, the bell-shaped speaker housing is of a considerable depth, requiring additional head room between the suspended ceiling and upper supporting structure.

U.S. Pat. No. 4,330,691 discloses a speaker mounted to the backside of a conventional ceiling tile. In one embodiment, the rear of the speaker on the backside of the ceiling tile is enclosed with a sound absorbing enclosure.

U.S. Pat. No. 4,484,658 discloses an assembly for mounting a speaker in a hole cut in a conventional ceiling tile. The mounting assembly includes a rigid backing structure which secures the speaker to the ceiling tile and reinforces the assembly to compensate for the low supporting strength of the ceiling tile per se.

The prior art, of which the foregoing patents are representative of the most relevant art known to the inventor, is characterized by assemblies adapted to support a single speaker, mount the speaker to an existing acoustic ceiling tile, and/or enclose the rear of the speaker in a large or bulky enclosure. Ceiling tiles of a lightweight fibrous, foam, or similar material are structurally weak and mounting a speaker directly to the tile may result in the tile sagging or failing under load. Some prior art constructions utilize a supporting mounting framework to compensate for the lack of tile strength. Such constructions, however, tend to be mechanically complex and difficult to install or remove. It would be desirable, therefore, to have a complete modular speaker system which could be easily installed in virtually any conventional suspended ceiling system simply by substituting the speaker module for a ceiling tile. Such a speaker module should be completely self-contained, strong and rigid enough to support the components, of a low profile to allow it to be installed in a suspended ceiling with little back clearance, and have an aesthetically attractive outer face to match or compliment adjacent ceiling tiles.

SUMMARY OF THE INVENTION

The present invention is directed to a completely self-contained, low profile modular speaker system adapted to be installed in the supporting gridwork of a suspended ceiling in place of a conventional acoustic ceiling tile. The modular system of the present invention is intended to overcome the various problems and deficiencies in prior art systems discussed above.

The modular assembly of the present invention includes a rectangular component mounting panel having a shape and outside dimensions which correspond to the size and shape of a conventional ceiling tile. The panel is provided with a pair of openings in which are mounted a pair of matched speakers, namely, a woofer and a tweeter. A tuned shallow rear housing is attached to the back face of the mounting panel to enclose the rear portions of the speakers for optimum efficiency and sound quality and any other components of the system attached to the back of the mounting panel. An electrical connector of conventional construction is attached to the outside of the rear housing to provide electrical connection to the source of power for the speakers. The electrical leads from the speakers or other system components extend through the wall of the housing for connection to the electrical connector. The outer face of the mounting panel and the speakers mounted therein is enclosed by a demountable grill attached to the outer face of the mounting panel. The grill is smaller in outside dimension than the mounting panel such that it may be removed for cleaning or to provide access to the speakers without disturbing the position of the mounting panel or other components of the assembly attached to the rear thereof.

The speakers are preferably attached by their integral peripheral mounting flanges to the outer face of the mounting panel and are set in appropriate recesses surrounding the speaker openings to provide a flush mounting. The entire module is supported by the outer peripheral edge of the mounting panel resting along an enclosing section of the ceiling supporting grid comprising, for example, suspended metal strips having an inverted T-shape. The interface between the mounting panel edge and the supporting grid preferably includes a thin insulating strip of foam material attached to the mounting panel. The outer enclosing grill includes a rigid frame member and a cloth cover attached to the frame member. The grill frame member includes attachment on its inner surface adapted to cooperate with attachment means on the outer face of the mounting panel to effect easy demountable attachment of the grill to the panel. The cloth cover for the grill may include a material which matches in color and/or texture the surface of the adjacent ceiling tiles. A conventional level control may be installed with the speakers on the outer face of the mounting panel. The rear enclosing housing may be provided with an interior lining of a sound absorbent material completely surrounding the speakers and other components extending into the enclosure.

For a module having nominal outside dimensions of 2'×2', but entire modular system may have a depth of only $4\frac{1}{2}$" or less, making it readily installable even in those suspended ceiling systems having very little clearance above the ceiling tiles.

DETAILED DESCRIPTION OF THE PREFERRED EMBODIMENT

Figures 1, 2, 3:
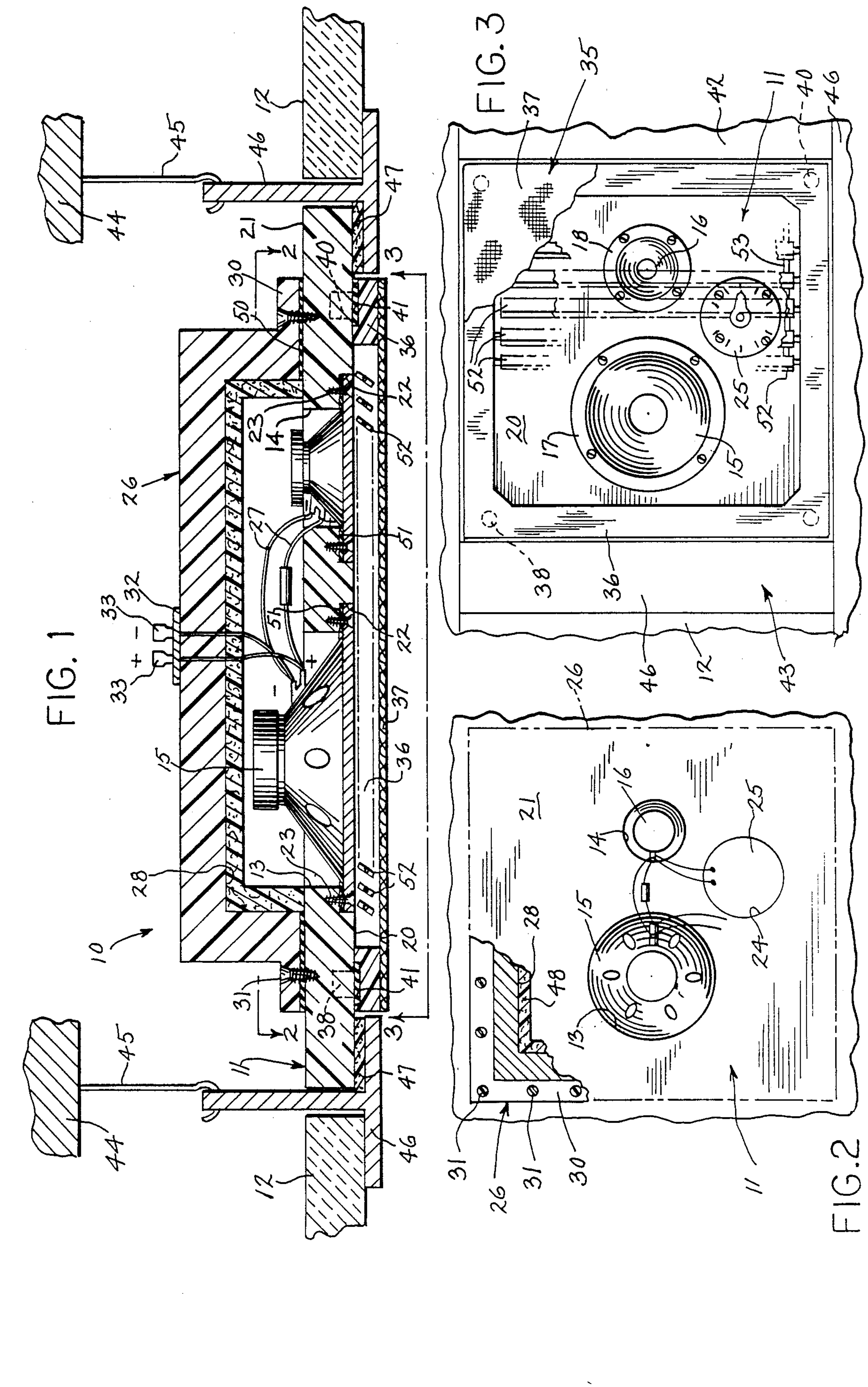
FIG. 1 is a vertical sectional view through the modular speaker system of the present invention and additionally showing the supporting gridwork of a suspended ceiling system in which the module is mounted.
FIG. 2 is a horizontal section through the module taken on line 2—2 of FIG. 1.
FIG. 3 is a bottom view of the demountable grill covering the front of the module with certain components broken away to show the interior construction thereof.

Referring to the drawing, a modular sound system 10 includes a component mounting panel 11 of a generally rectangular shape. In the particular embodiment shown, the mounting panel 11 is square in plan view and is nominally 24" on a side to conform to the size and shape of a conventional 2'×2' acoustic ceiling tile 12, only a portion of which is shown in FIG. 1. The exact side dimensions of the mounting panel 11 are slightly shorter to accommodate the supporting grid of a conventional suspended ceiling system. Thus, the mounting panel is preferably 2 $3\frac{3}{4}$ square.

The mounting panel 11 is provided with a large speaker opening 13 and a small speaker opening 14 adajcent one another and generally centered with respect to one pair of opposite edges of the panel. A larger woofer speaker 15 is mounted in the large speaker opening 13 and a small tweeter speaker 16 is mounted in the small speaker opening 14. The woofer 15 may, for example, have a maximum diameter of about 8" defined by its integral peripheral mounting flange 17. The tweeter 16 may, for example, have a diameter of about 3" also defined by its outer peripheral mounting flange 18. The speakers 15 and 16 are preferably flush mounted to the outer face 20 of the mounting panel 11 with the rear portions of the speakers extending upwardly through their respective openings to project past the rear face 21 of the mounting panel. The mounting flanges 17 and 18 of the speakers 15 and 16, respectively, are recess mounted in the outer face 20 of the mounting panel 11 in suitable recesses 22 formed in the mounting panel around the perimeter of each of the openings 13 and 14. The speakers are attached to the mounting panel with a series of mounting screws 23 extending through the flanges 17 and 18 and into the body of the panel 11. The mounting panel 11 may also be provided with a control opening 24 in which a speaker level control 25 for the tweeter 16 may be mounted. The level control 25 is also preferably mounted flush with the outer face 20 of the mounting panel such that with the speakers 15 and 16 it may be easily removed for repair or replacement, as will be more fully described hereinafter.

A housing 26 is attached to the rear face 21 of the mounting panel 11 to completely enclose the rear portions of the speakers 15 and 16, the level control 25 (if utilized), and the usual electrical leads 27 to and between the speakers and other components. The housing 26 has a square shape in plan view, but is somewhat smaller than the mounting panel 11 to which it is attached. The housing has a shallow square interior 28 just deep enough to be disposed closely spaced from the rear of the larger woofer speaker 15. The shape and volume of the inerior 28 of the housing provide a tuned system for optimized efficiency and sound quality, while retaining a low depth profile to facilitate installation, as will be described below. The housing includes an integral outer peripheral flange 30 adapted to lie flush against the rear face 21 of the mounting panel and through which suitable mounting screws 31 extend to attach the housing 26 to the mounting panel 11. Alternately, the housing may be attached to the mounting panel which an adhesive or some other attachment means. Both the housing 26 and the mounting panel 11 are preferably molded from a suitable high density plastic with each of the pieces molded separately, as indicated. An electrical connector 32 is attached to the upper outside surface of the housing 26, preferably in a position generally centered between the speakers 15 and 16. The connector 32 may include a pair of standard spade connectors 33 or any other suitable type of connectors for external attachment of the wires providing power to the speakers. The electrical leads 34 from the speakers extend through the rear wall of the housing 26 and are conductively attached to the electrical connector 32. Single point connection of only two external power leads to the sound system module 10 greatly simplifies and facilitates installation.

The outer face 20 of the mounting panel 11 is enclosed with a demountable grill 35. The grill 35 is also preferably of a square shape and is large enough to cover the exposed outer faces of the speakers 15 and 16, as well as the balance control 25, if utilized. The outside dimensions of the grill 35 are, however, smaller than those of the mounting panel 11 so that the grill may be easily detached from the panel after the module has been installed and, correspondingly, the outer edge of the mounting panel is unobstructed for installation, as will be hereinafter described. The grill 35 includes a rigid outer frame member 36 and a cloth cover 37 preferably atached to cover the entire exposed outer surface of the frame member 36. The frame member is preferably molded of a plastic material similar to or the same as that used for the mounting panel and the housing. To provide for demountable attachment of the frame to the mounting panel, the inner face of the frame member 36 is provided with a series of integral cylindrical mounting studs 38 which are adapted to be inserted and held with a press fit in a corresponding array of mounting holes 40 in the outer face 20 of the mounting panel. The mounting studs 38 may be covered or the mounting holes lined with a rubber-like material to enhance the frictional contact to help hold the grill firmly in place. Also, suitable washers 41 of rubber or other synthetic material may be placed between the mounting panel/-frame interface to absorb vibrations. The rubber washers 41 may be made as an integral part of the rubber lining or covering for the mounting holes 40. The cloth cover 37 may be made of any suitable acoustically transparent material and preferably is painted or otherwise colored and also provided with a texture to match the adjacent ceiling tiles 12.

The entire assembled speaker system module 10 is inserted into and supported by the enclosing section 42 of a conventional supporting grid 43 for a suspended ceiling. The supporting grid 43 includes the usual inverted T-shaped members 46 suspended from the permanent ceiling structure 44 by wire hangers 45. The enclosing grid section 42, of course, is appropriately dimensioned to allow the peripheral edge of the mounting panel to rest on one leg of the T members 46. Preferably a narrow strip 47 of insulating foam material is attached to the outer face of the mounting panel around its peripheral edge to provide a vibration absorbing interface between the module and the supporting grid 43.

As best shown in FIG. 1, the grill frame 36 is sufficiently wide in the vertical direction to project downwardly below the level of the supporting grid 43. This allows the grill 35 to be easily grasped by its edges for removal, and also provides a downward projection similar to that provided by certain styles of acoustic tiles 12 currently in use, as shown.

The interior of the rear housing 26 may be lined with a layer of a sound absorbing material 48, such as a fiberglass mat. Also, a gasket 50 of rubber or other suitable material is preferably placed between the mounting flange 30 of the housing 26 and the rear face 21 of the mounting panel to which the housing is attached. Similarly, suitable gaskets 51 may be placed in the recesses 22 in the speaker openings 13 and 14 before the speakers are mounted therein. In this manner, all of the joints between major connected components of the systems are sealed for air tightness and to attenuate vibrations.

In a square module having nominal 2′ edges, the thickness of the module from the outer face of the grill 35 to the rear face of the housing 26 may be $4\frac{1}{2}$ or less. In this manner, the module 10 may be readily installed in place of a conventional ceiling tile 12 even in those suspended ceilings where there is little head room between the level of the ceiling tiles 12 and the primary ceiling structure 44. Nevertheless, the rear housing 26 provides a completely sealed rear enclosure for the rear of the speakers to eliminate sound loss, yet retain the low profile allowing easy installation in virtually any suspended ceiling.

As an additional feature, the outer edges of the outer frame member 36 may be beveled to match ceiling tiles having similar beveled edges. For ceiling constructions in which the faces of the tiles are flat and do not protrude below the supporting grid 43, a square spacer ring of a shape similar to the insulating strip 47 may be inserted between the strip and the supporting face of the T-shaped member 46. In this manner, the entire module may be raised so the surface of the speaker cover 37 lies in the plane of the faces of the ceiling tiles. Also, the interior of the outer frame 36 may be provided with a series of adjustable louvers 52 behind the cloth cover 37 to selectively direct the sound toward a particular area of a room. Each of the louvers may be pivotally mounted in opposite edges of the frame 36 and operable with a common adjustment bar 53 in a well known manner. To preserve the clarity of FIG. 3, only a few louvers are shown, it being understood, however, that the louvers would normally lie disposed over the entire interior of the frame.

Various modes of carrying out the present invention are contemplated as being within the scope of the following claims particularly pointing out and distinctly claiming the subject matter which is regarded as the invention.

I claim:

1. A low profile modular sound system for installation in a suspended ceiling having a supporting grid within which a plurality of ceiling tiles are supported, said system intended to replace one of the ceiling tiles and comprising:
   - a rectangular component mounting panel having a back face and an outer face and outside dimensions corresponding to the ceiling tile, said panel having a pair of openings therein;
   - a pair of matched speakers mounted in said panel openings each of said speakers including an outer face and a rear portion;
   - a shallow rear housing having enclosing rear and side walls and an open front end defining a hollow interior attached to the back face of said mounting panel and enclosing the rear portions of said speaker within said interior said rear and side walls having an exterior surface;
   - electrical connector means on the exterior surface of one of said housing walls for connection to an external source of power for said speakers;
   - electrical leads from said speakers extending through said one wall of said housing and electrically connected to said connector means; and,
   - an enclosing grill demountably attached to the outer face of said mounting panel and adapted to cover the outer faces of said speakers, said grill having outside dimensions smaller than said mounting panel.

2. The apparatus as set forth in claim 1 wherein each of said speakers includes an integral peripheral mounting flange for attaching the speaker to the outer face of said mounting panel.

3. The apparatus as set forth in claim 2 including a concentric recess in the outer face of said panel for each of said openings adapted to receive therein the mounting flange of a speaker.

4. The apparatus as set forth in claim 1 wherein the outer face of said mounting panel includes an outer peripheral edge adapted to rest on and to be supported by an enclosing section of the ceiling supporting grid.

5. The apparatus as set forth in claim 4 wherein the outer peripheral edge of the mounting panel and the supporting grid define a supporting interface therebetween and further including a thin insulating strip of foam material disposed in said supporting interface.

6. The apparatus as set forth in claim 5 including a spacer ring disposed between the insulating strip and the supporting grid, said ring having a thickness sufficient to dispose said enclosing grill coplanar with said plurality of ceiling tiles.

7. The apparatus as set forth in claim 1 wherein said enclosing grill comprises:
   - a rigid frame member having an open interior, an outer surface and an opposite inner surface, said inner surface being in contact with the outer face of said mounting panel; and,
   - a cloth cover attached to the outer surface of said frame member.

8. The apparatus as set forth in claim 7 including attachment means on the inner surface of said frame member and the outer face of said mounting panel for effecting the demountable attachment therebetween.

9. The apparatus as set forth in claim 3 wherein said speaker comprises a woofer and a tweeter.

10. The apparatus as set forth in claim 9 including a level control interconnecting said speakers.

11. The apparatus as set forth in claim 3 including a lining of sound absorbent material on the interior of said housing surrounding said speakers.

12. The apparatus as set forth in claim 7 including means attached to said enclosing grill for selectively directing the sound of the system.

13. The apparatus as set forth in claim 12 wherein the means for directing the sound comprises a series of adjustable louvers pivotally mounted to the interior of said frame member.

* * * * *